United States Patent
Min (10) Patent No.: US 6,844,224 B2
(45) Date of Patent: Jan. 18, 2005

(54) SUBSTRATE CONTACT IN SOI AND METHOD THEREFOR

(75) Inventor: Byoung W. Min, Austin, TX (US)

(73) Assignee: Freescale Semiconductor, Inc., Austin, TX (US)

(*) Notice: Subject to any disclaimer, the term of this patent is extended or adjusted under 35 U.S.C. 154(b) by 0 days.

(21) Appl. No.: 10/002,054

(22) Filed: Nov. 15, 2001

(65) Prior Publication Data

US 2003/0089948 A1 May 15, 2003

(51) Int. Cl.[7] .......................... H01L 21/00; H01L 21/84
(52) U.S. Cl. ........................................................ 438/164
(58) Field of Search ................................ 438/164, 637, 438/526, FOR 196, FOR 222

(56) References Cited

U.S. PATENT DOCUMENTS

| | | | |
|---|---|---|---|
| 5,185,535 A | * 2/1993 | Farb et al. ................. 257/351 |
| 5,314,841 A | 5/1994 | Brady et al. |
| 5,889,293 A | * 3/1999 | Rutten et al. ................ 257/74 |
| 5,889,306 A | 3/1999 | Christensen et al. |
| 5,929,488 A | 7/1999 | Endou |
| 5,945,712 A | 8/1999 | Kim |
| 5,994,759 A | * 11/1999 | Darmawan et al. ......... 257/538 |
| 6,063,686 A | * 5/2000 | Masuda et al. ............. 438/406 |
| 6,218,248 B1 | 4/2001 | Hwang |
| 6,303,414 B1 | * 10/2001 | Ang et al. .................. 438/155 |
| 6,372,562 B1 | * 4/2002 | Matsumoto ................. 438/164 |
| 6,407,427 B1 | * 6/2002 | Oh ............................ 257/347 |
| 2001/0025991 A1 | 10/2001 | Kim |
| 2002/0115244 A1 | * 8/2002 | Park et al. .................. 438/152 |

FOREIGN PATENT DOCUMENTS

| | | |
|---|---|---|
| JP | 2000-243967 | 9/2000 |
| WO | WO 99/33115 | 7/1999 |

OTHER PUBLICATIONS

PCT International Search Report (PCT/US02/34959).

* cited by examiner

*Primary Examiner*—Hsien Ming Lee
(74) *Attorney, Agent, or Firm*—James I. Clingan, Jr.; Kim-Marie Vo (57) ABSTRACT

A doped area is formed in the silicon substrate layer of a silicon-on-insulator stack including a silicon substrate, an insulator layer and an silicon active layer, by implanting a species through at least the insulator layer. In one embodiment, the silicon active layer is etched and the species are implanted in the silicon substrate through the exposed insulator layer. Thus, a doped region is formed in the silicon substrate under the areas where the silicon active layer was removed. In another embodiment after etching the silicon active layer, a dielectric layer is formed adjacent to the silicon active layer and on the insulator layer. In this embodiment, the species are implanted over the entire wafer through both the silicon active layer and the insulator layer. In both embodiments, the species are implanted before forming a gate electrode of a transistor.

11 Claims, 7 Drawing Sheets

SUBSTRATE CONTACT IN SOI AND METHOD THEREFOR

BACKGROUND OF THE INVENTION

1. Field of the Invention

This invention relates to silicon-on-insulator (SOI) substrates, and more particularly, to contacts to the SOI substrate.

2. Related Art

Silicon-on-insulator devices (SOI) devices are becoming the most common structure for new semiconductor designs. The SOI devices have the advantage of very excellent isolation. The structure is a silicon substrate having an overlying insulator with an overlying active layer with the devices made in the overlying active layer. The isolation completely penetrates the active layer so that the wells that are contained in a particular active area are completely isolated from other active areas. One of the difficulties with SOI devices is that the substrate does not have a convenient way to be contacted. If the substrate is left floating the substrate can influence, detrimentally, the operation of transistors in the active areas. This can cause the transistor devices to have excessive leakage, for example. In order to overcome this difficulty of a floating substrate, several techniques have been developed for making contact to it.

There are two basic approaches to making this contact. One is called backside contact, which is achieved to the backside of the semiconductor die, and the other is frontside contact, which is achieved through the side of the semiconductor die that has active circuitry. These techniques have varying types of difficulties themselves. For the frontside contact, one difficulty is having a sufficient electrical contact to the substrate. Another difficulty is that while forming an effective contact to the substrate the other devices are adversely affected.

The backside contact involves utilizing a packaging type contact in which the package itself makes contact to the backside of the silicon substrate. Although this is effective, it has also been found to be quite expensive.

Thus, there is a need for a frontside contact that avoids the problems of adversely affecting the other devices while having a sufficiently conductive contact.

DESCRIPTION OF THE INVENTION

A good contact to the substrate from the frontside is achieved by using an early implant. The implant is through an active layer and an insulating layer and into the substrate after the isolation areas have been formed but before transistor formation or, in one alternative, after the isolation areas have been etched to form the trenches but before those trenches are filled with insulating material. After implanting into the substrate of the SOI structure, transistor and contact formation is performed resulting in a highly conductive contact to the substrate. This is better understood by reference to the drawings and the following description.

Figure 1:
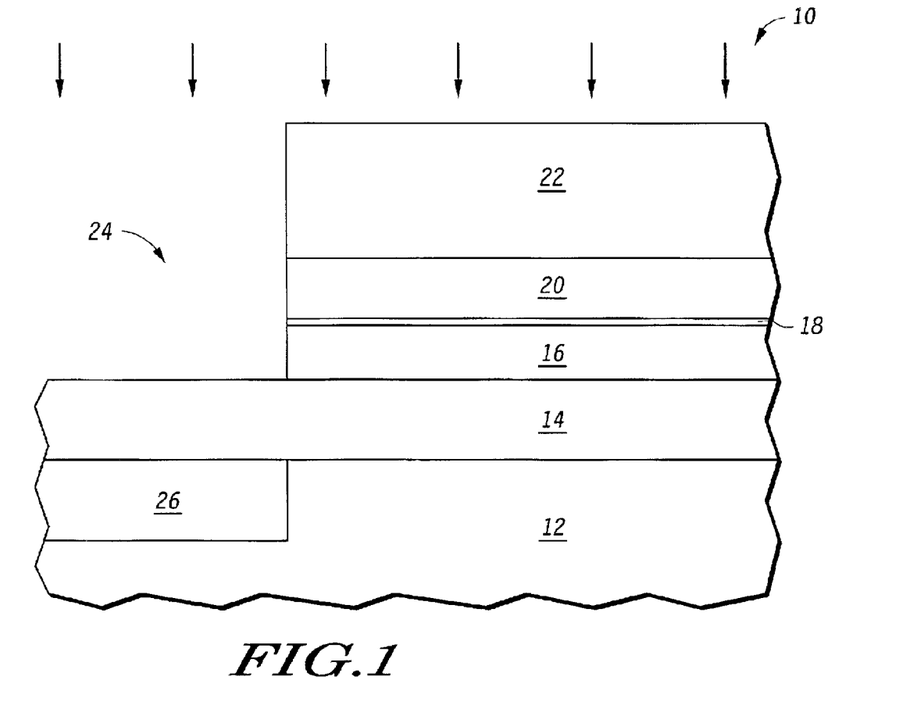
FIGS. 1–8 are cross sections of a SOI device in sequential steps of formation according to an embodiment of the invention.

Shown in FIG. 1 is a silicon-on-insulator (SOI) device 10 comprising a substrate 12, insulator layer 14, active layer 16, a pad oxide layer 18, a nitride layer 20, a photoresist layer 22, a contact region 26, and an opening 24 in photoresist layer 22, nitride layer 20, pad oxide layer 18 and active layer 16. Insulator layer 14 overlies substrate 12. Substrate 12 is preferably silicon. Active layer 16 is preferably silicon and is in the area in which transistors are to be formed. The combination of a silicon substrate such as substrate 12 with an overlying insulator layer such as insulator layer 14 with a further overlying layer of silicon such as active layer 16 comprise a semiconductor stack that is typical for SOI devices.

An implant is performed on this SOI device 10 to form contact region 26 in substrate 12. Contact region 26 is heavily doped to P+ by, preferably, boron. An alternative is indium. Prior to the implant being performed, photoresist layer 22 was patterned so that opening 24 is formed. With photoresist layer 22 being patterned, nitride layer 20, pad oxide layer 18 and active layer 16 are etched to complete the formation of opening 24. The implant of boron is completely absorbed prior to reaching active layer 16. This absorption is primarily by photoresist layer 22 which may be 10,000–12,000 angstroms thick. Nitride layer 20 is preferably 1,400 angstroms thick, pad oxide layer 18 is preferably 100 angstroms thick, and active layer 16 is preferably 1,000 angstroms thick. With these thicknesses of photoresist layer 22 and nitride layer 20 the implant is completely absorbed well prior to reaching active layer 16. The energy of the implant is preferably 50 KeV and may be increased somewhat to 60 KeV. The insulator layer 14 is preferably silicon oxide and 2,000 angstroms thick. The implant of boron at 50–60 KeV results in the formation of contact region 26 which may be a depth of as much as 2,000 angstroms but is not so much as to have a small amount at the interface between substrate 12 and insulator layer 14. If the energy is too great, the doping level of contact region 26 at the interface may be undesirably low. 50–60 KeV has been found to be very effective for a thickness of 2,000 angstroms for insulator layer 14 being silicon oxide. Other thicknesses of insulator layer 14 would require experiments to determine the optimum energy for the implant. These experiments are easily performed, and experimenting with varying energies to achieve a particular depth is a technique well known in the industry.

The structure shown in FIG. 1 prior to the implant is known in the industry. This is a configuration prior to forming isolation regions that isolate active areas formed in active layer 16. An implant at this point deviates from the conventional processing and causes the formation of the contact region 26 which will be subsequently used for electrical contact to substrate 12. This implant does take advantage of the mask pattern that is used for the formation of the isolation regions. Thus, there is not required an extra mask for the implant.

Figure 2:
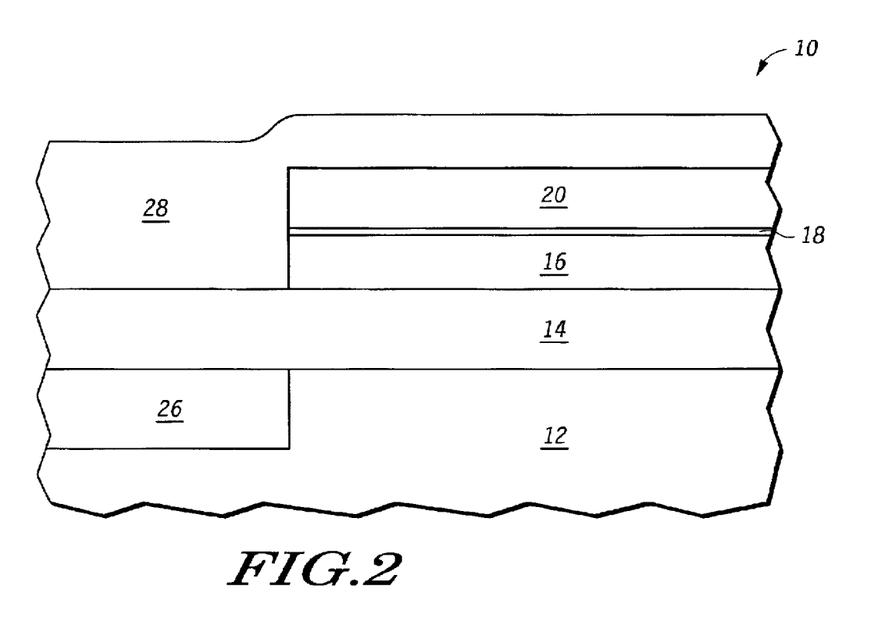

Shown in FIG. 2 is SOI device 10 after photoresist layer 22 has been removed and an insulator layer 28 has been formed over insulator layer 14 and nitride layer 20.

Figure 3:
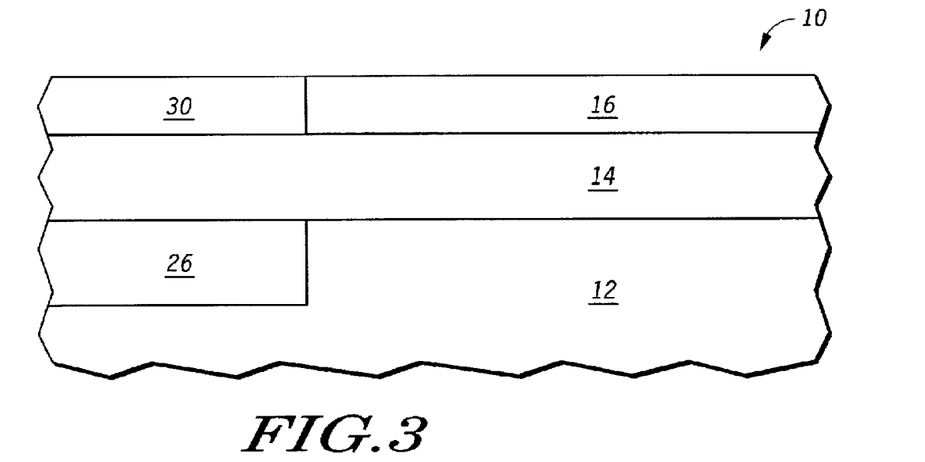

Shown in FIG. 3 is SOI device 10 after a chemical-mechanical polishing (CMP) step has been performed. This CMP step removes most of insulator layer 28, all of nitride layer 20, and all of pad oxide layer 18 to expose active layer 16. This leaves a portion of insulator layer 28 which is isolation region 30.

Figure 4:
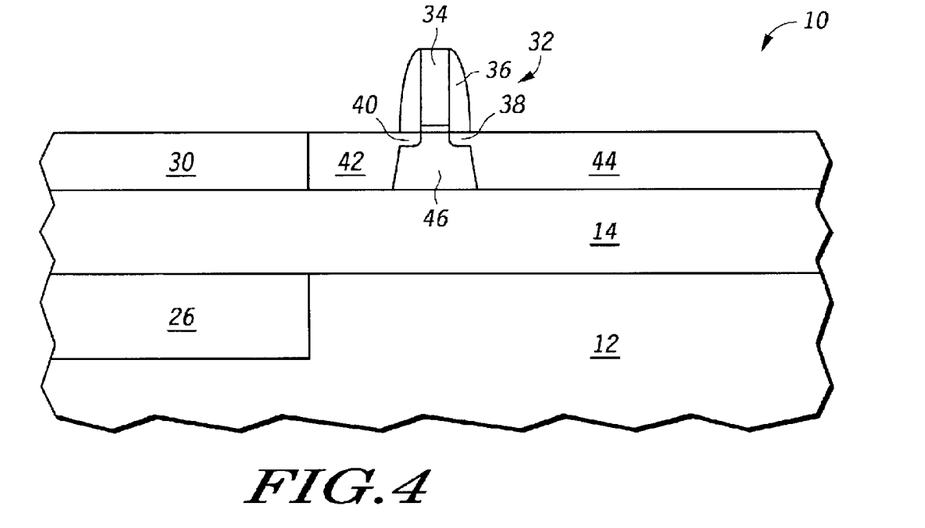

Shown in FIG. 4 is SOI device 10 after formation of a transistor 32 in active layer 14. Transistor 32 has a gate 34, sidewall spacer 36 around gate 34, a drain extension 38, a source extension 40, a source 42, a drain 44, and a body 46. Body 46 is of the same doping type and level as active layer 16 prior to formation of transistor 32. Source/drains 42 and 44 and source/drain extensions 38 and 40 are doped to N-type. The active layer 16, as shown in FIGS. 1–3, is P-type. Thus, body 46 is P-type and contains the channel for transistor 32. A gate dielectric separates gate 34 from the channel in body 46.

Figure 5:
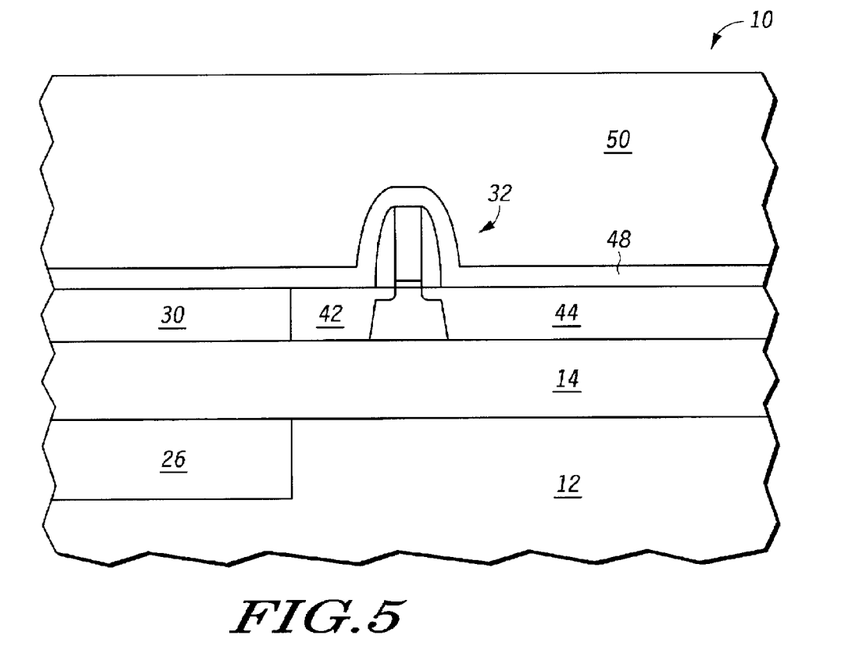

Shown in FIG. 5 is SOI device 10 after formation of a plasma enhanced nitride (PEN) layer 48 and an interlayer dielectric (ILD) layer 50. PEN layer 48 operates as an etch stop layer. ILD 50 is a relatively thick layer and is preferably 3,500 angstroms. PEN layer 48 is preferably 500 angstroms. ILD layer 50 is preferably of silicon oxide which may be formed from TEOS or high density plasma (HDP) oxide.

Figure 6:
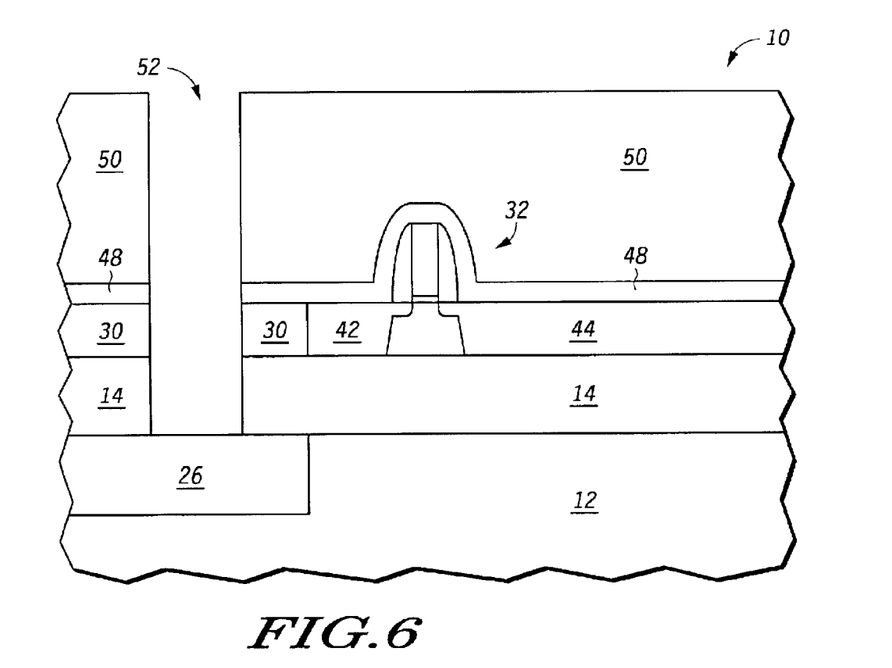

Shown in FIG. 6 is SOI device 10 after contact hole 52 has been formed through ILD layer 50, PEN layer 48, isolation region 30, and insulator layer 14 to contact region 26. This contact hole 52 is preferably 3,000 angstroms in diameter.

Figure 7:
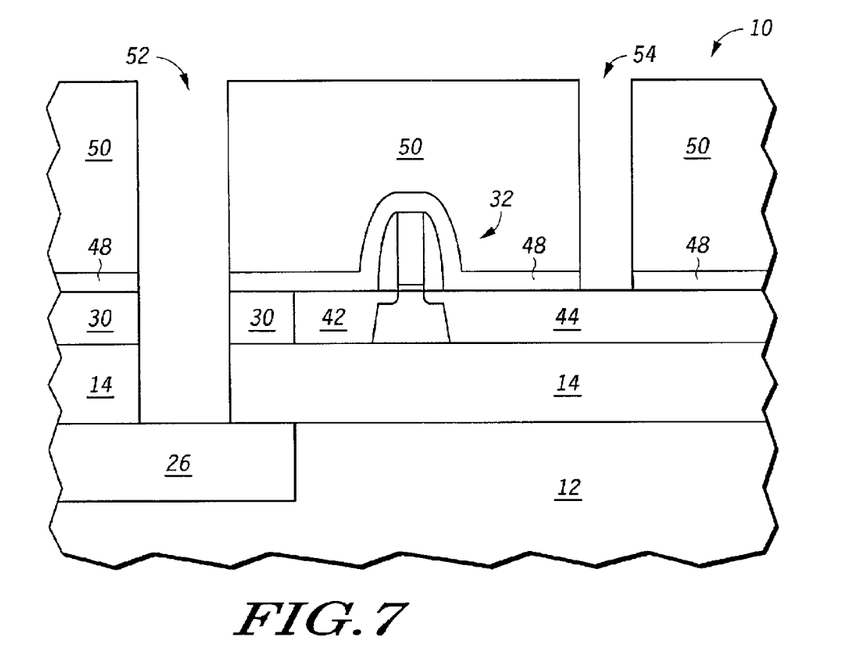

Shown in FIG. 7 is SOI device 10 after a contact hole 54 has been formed to contact drain 44 of transistor 32. Contact hole 54 is through ILD layer 50 and PEN layer 48 and stops at drain 44 formed in active layer 16. Contact hole 54 is formed in preparation for making contact to drain 44, and contact hole 52 is formed in preparation of making contact to contact region 26.

Figure 8:
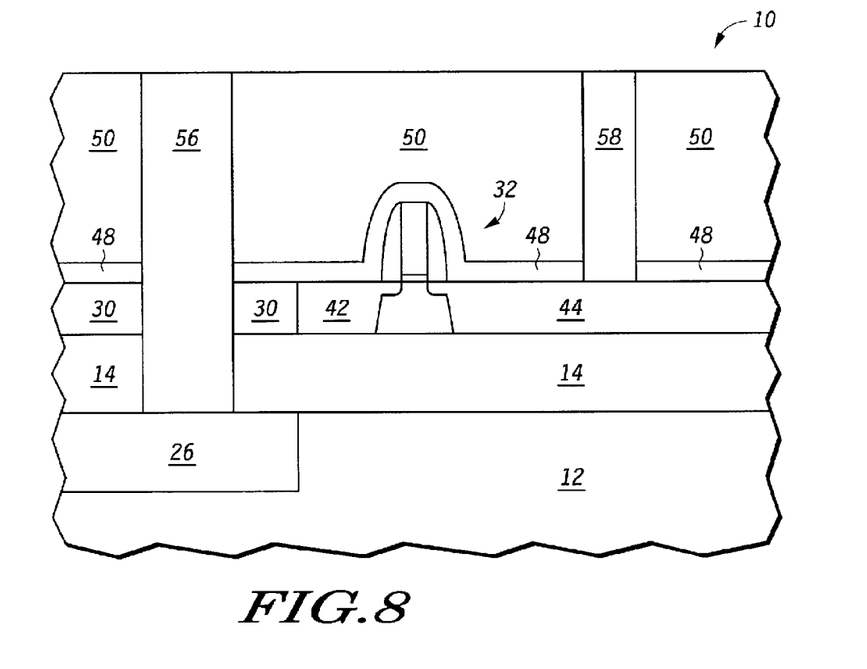

Shown in FIG. 8 is SOI device 10 after formation of contacts 56 and 58 in contact holes 52 and 54 respectively. Contact 56 fills contact hole 52 and is subsequently etched back by CMP. Similarly, contact 58 fills contact hole 54 and is etched back by the CMP step so that a planar surface is formed of contacts 56, 58, and ILD layer 50. Contacts 56 and 58 are preferably tungsten. The contact holes 52 and 54 are performed in separate steps. Thus, contact hole 54 does not have to be excessively over etched and avoids the problem of an excessive widening of contact hole 54. If the contact hole 54 is formed while contact hole 52 is also being formed, then active layer 16 and thus drain 44 is reached well before contact hole 52 is completely formed. The result would be and has been an undesirable widening of contact hole 54. In the case shown in FIG. 8, there is significant distance from contact hole 54 and transistor 32. However, in other portions of the chip where contacts are formed, the alignment of contact hole 54 to drain 44 may be very close to transistor 32. With the excessive widening that would occur for contact hole 54 for the case when it is etched while contact hole 52 is formed, contact 58 may be formed too close to transistor 32 and result in excessive capacitance coupling, a reliability issue due to damage to sidewall spacer 36 such as a short circuit to body 46, or a short circuit to gate 34.

Figure 9:
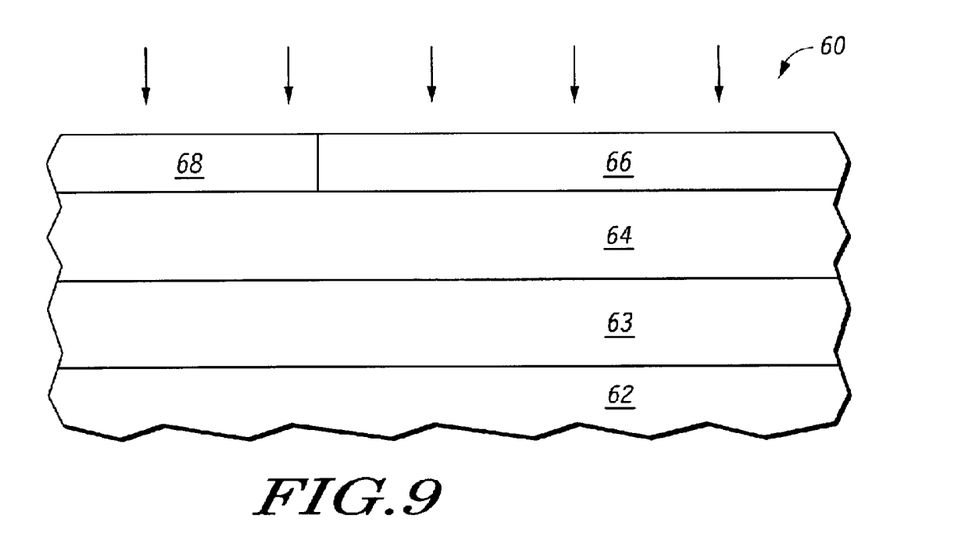
FIGS. 9–14 are cross sections of a SOI device in sequential steps of formation according to an alternative embodiment of the invention.

Shown in FIG. 9 is SOI device 60 comprising a substrate 62 having a contact region 63 formed therein. SOI device 10 further comprises an insulator layer 64, an active layer 66, and an isolation region 68. Isolation region 68 is adjacent to active layer 66 and both overlie insulator layer 64. Contact region 63 is formed by a blanket implant of preferably boron at 100 KeV. The boron is preferred over indium because it is lighter. Indium may be effective as well, but boron will more easily penetrate through active layer 66 and isolation region 68 as well as insulator layer 64. Thus, the result of the implant of boron is a heavily doped contact region which is under insulator layer 64 throughout a particular semiconductor wafer. SOI device 60 shows only a portion of a complete die and wafer. The structure shown in FIG. 9 is conventional except for the implant and the consequent effect of the implant. The formation of an isolation region 68 adjacent to an active layer 66 overlying an insulator 64 which in turn overlies a substrate of silicon is conventional. The implant at this point provides for the beneficial contact region 63 which is not conventional.

Figure 10:
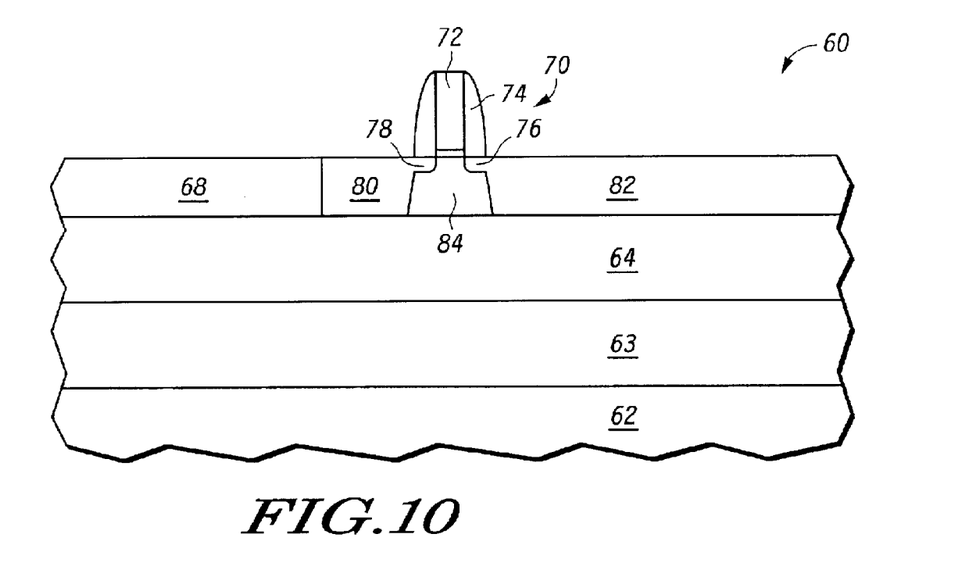

Shown in FIG. 10 is SOI device 60 after formation of transistor 70. The formation of transistor 70 results in active layer 66 being doped to achieve the desired transistor function. Transistor 70 comprises a gate 72, a sidewall spacer 74, a drain extension 76, a source extension 78, a source 80, a drain 82 and a body 84. Body 84 contains the channel for transistor 70 and is separated from gate 72 by a gate dielectric. In this example active layer 66 is P-type so that source/drains 80 and 82 are N-type. Body 84 remains P-type.

Figure 11:
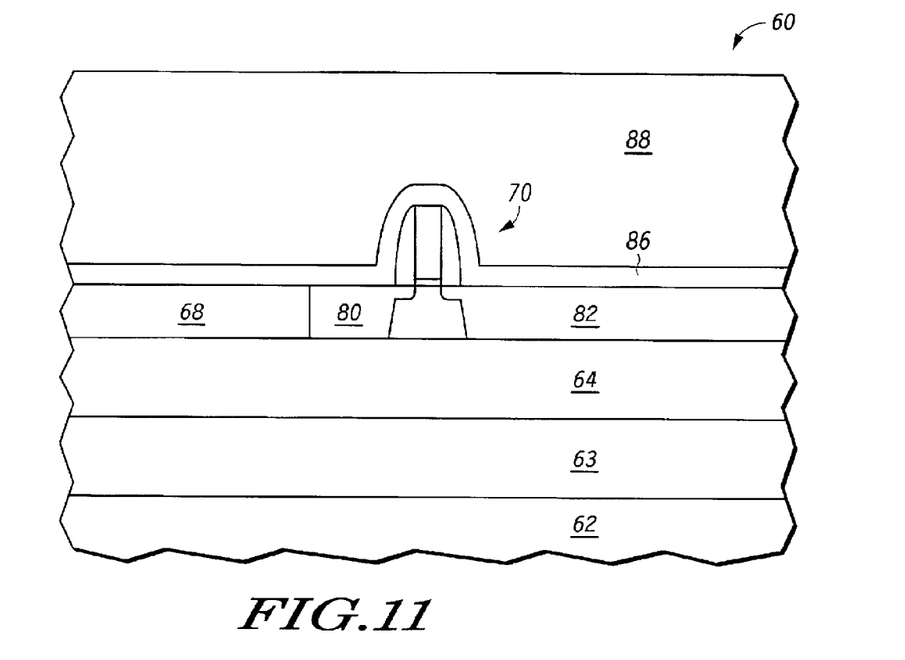

Shown in FIG. 11 is SOI device 60 after formation of a PEN layer 86 and an ILD layer 88. PEN layer 86 is preferably 500 angstroms thick and ILD layer 88 is preferably 3,500 angstroms in thickness.

Figure 12:
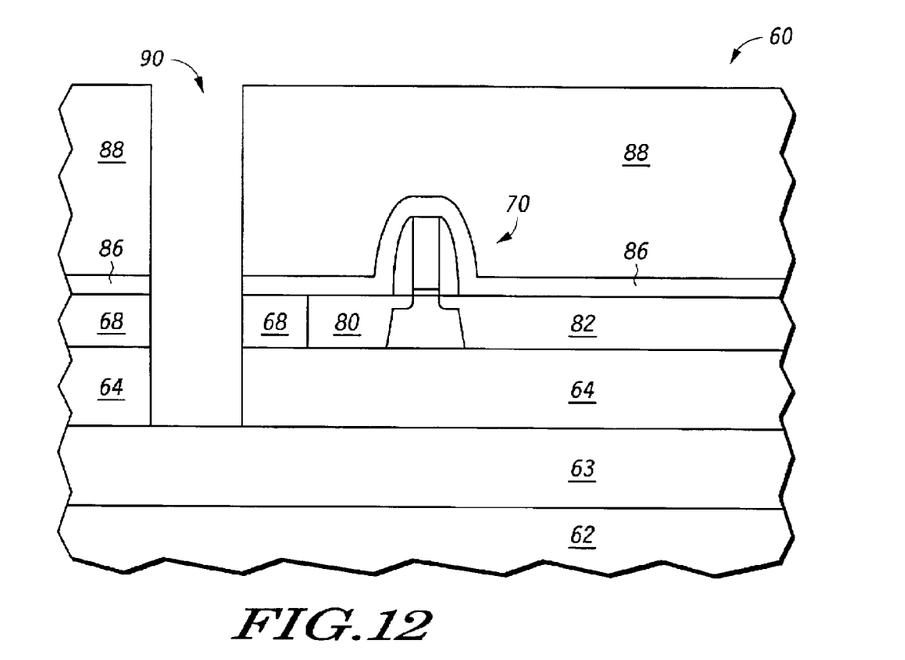

Shown in FIG. 12 is SOI device 60 after formation of a contact hole 90. Contact hole 90 is formed through ILD 88, PEN layer 86, isolation region 68 and insulator layer 64 and terminates at contact region 63. Contact hole 90 is preferably 3,000 angstroms in diameter.

Figure 13:
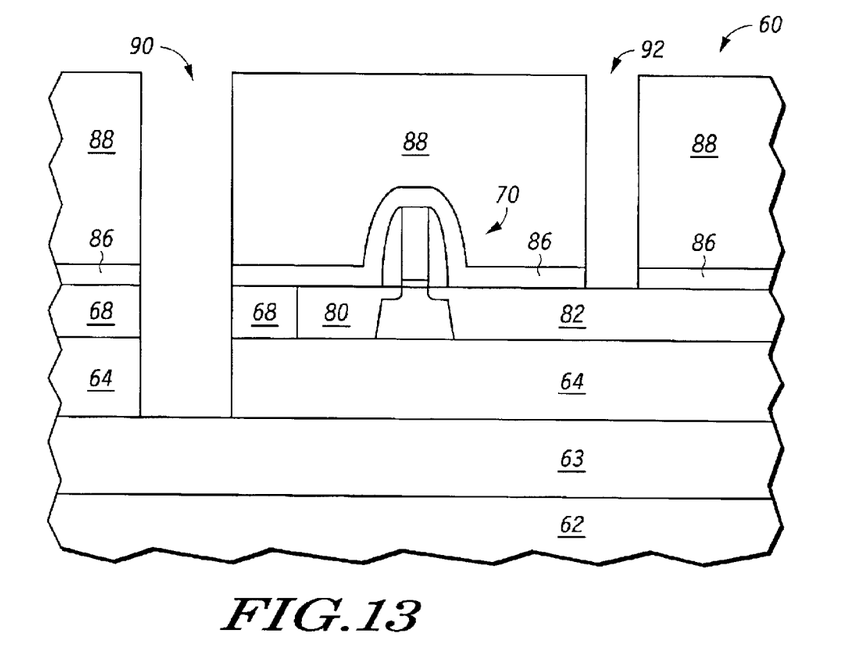

Shown in FIG. 13 is SOI device 60 after formation of a contact hole 92 which is formed through ILD layer 88, PEN layer 86, and terminates at drain 82.

Figure 14:
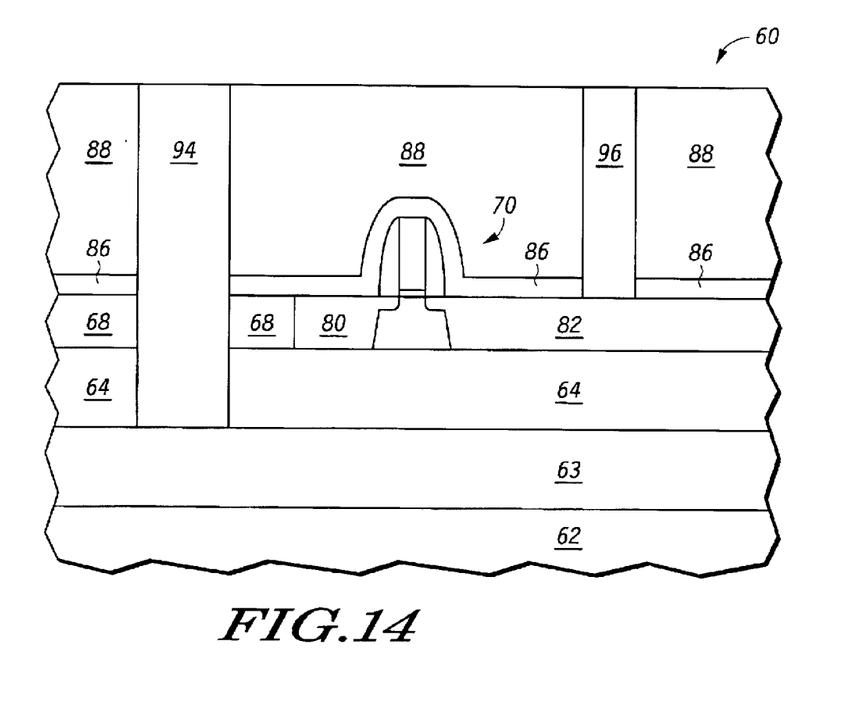

Shown in FIG. 14 is SOI device 60 after formation of contact 94 in contact hole 90 and contact 96 in contact hole 92. These contacts, 94 and 96, are formed by depositing tungsten and then performing a CMP step. The result is contact 94 is in physical contact and electrical contact with contact region 63 and contact 96 is in physical and electrical contact with drain 82. SOI device 60 has a contact region 63 which covers the entire die. Thus, there is better contact and a quicker response for electrical disturbances present and received by substrate 62. These electrical disturbances are more quickly quieted through contact 94 as a result of the high conductivity of contact region 63. With respect to SOI device 10 of FIGS. 1–8, the implant that is performed is prevented from being received by the silicon surface which may be advantageous in some circumstances.

The various thicknesses and material types have been described in a particular embodiment. However, other materials may be utilized effectively and other thicknesses and dimensions may also be utilized. For example, the diameter contact 94 shown in FIG. 14 may be altered and the benefit may yet be received. Similarly, the implants have been described as being boron and possibly indium. This results in contact regions 26 and 63 being p-type doped regions, but it may be found desirable to use an N-type implant instead of the P-type implant to achieve n-type doped regions for contact regions such as contact regions 26 and 63. The PEN layers 48 and 86 were effective as an etch stop in the process of forming contacts more precisely and was described as being plasma enhanced nitride. Other materials may also be found to be effective for this purpose. Similarly, ILD layers 50 and 88 may be of different materials than those described herein. Similarly, active layers 16 and 66 may be a semiconductor different from silicon.

Heavily doped contact regions 63 and 26 are beneficial by avoiding the Schottky effects that may occur if a contact is formed to a relatively low doped semiconductor material. The adverse Schottky effect is that in one direction the conductivity may be sufficient but in another direction there may be a diode effect that may adversely impact the conductivity of that contact. By having the contact implant prior to transistor formation, the anneal that activates these implants is also prior to transistor formation. Thus, the thermal cycles relating to the implant activation do not impact the thermal budget for the transistors. Another alternative, which would not have this particular benefit, would be to perform the implant for the contact region 26 after formation of contact hole 52. This would still result in a good contact substrate 12 due to heavy doping but would require subsequent annealing to activate the implant. Also contact region 26 may be smaller due to subsequent formation of a contact hole as the patterned implant mask instead of using the larger area that results from using the same patterned mask for the contact implant that is used for the isolation region.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method for forming a contact to a semiconductor substrate of a first conductivity type, comprising:
    providing a semiconductor stack including an active layer formed on a first insulator layer and a masking layer over the active layer, wherein the first insulator layer is formed on the semiconductor substrate and wherein the active layer and the masking layer are patterned to have an opening;
    implanting the semiconductor substrate through the opening and the first insulator layer with a first species to form a first doped region within the semiconductor substrate, wherein the first doped region is the first conductivity type and is heavily doped, and wherein the masking layer operates as a mask to the implanting;
    after the implanting, forming a gate dielectric on the active layer;
    forming a gate electrode on the gate dielectric;
    forming a source region in the active layer adjacent a first side of the gate electrode;
    forming a drain region in the active layer adjacent a second side of the gate electrode, wherein the second side is opposite the first side; and
    forming a first contact electrically connected to the first doped region.

2. The method of claim 1, wherein the first species is p-type.

3. The method of claim 2, wherein the first species is boron.

4. The method of claim 3, wherein the implanting uses an energy of approximately 100 KeV.

5. The method of claim 1, further comprising:
    forming an interlayer dielectric layer over the active layer and the first doped region;
    etching a first opening in the interlayer dielectric layer;
    filling the first opening with a metal to form a second contact electrically connected to the active layer; and
    wherein forming a first contact further comprises:
        etching a second opening through the interlayer dielectric layer; and filling the second opening with the metal.

6. A method of forming an ohmic contact to a semiconductor substrate of a first conductivity type, comprising:
    providing a semiconductor stack including an active layer formed on a first insulator layer, wherein the first insulator layer is formed on the semiconductor substrate;
    forming a gate dielectric over the active layer;
    forming a gate electrode over the gate dielectric;
    forming source and drain regions in the active layer and adjacent the gate electrode as to form a channel region underneath the gate electrode;
    removing a portion of the active layer;
    forming a second insulator layer adjacent the active layer and on the first insulator layer;
    forming a doped region within the substrate before forming the gate electrode and after providing the semiconductor stack, wherein the doped region is the first conductivity type and is sufficiently heavily doped to be able to form the contact;
    forming a first opening in the second insulator layer and the first insulator layer; and
    forming a conductive material within the first opening.

7. The method of claim 6, further comprising forming a second opening and filling the second opening to form a contact that is electrically connected to the active layer.

8. The method of claim 6, wherein the doped region is p-type.

9. The method of claim 8, wherein the doped region is formed by ion implanting boron at an energy of 100 KeV.

10. The method of claim 6, wherein the semiconductor stack is silicon-on-insulator.

11. A method of forming a contact to a semiconductor substrate of a first conductivity type, comprising:
    providing a semiconductor stack including an active layer formed on a first insulator layer, wherein the first insulator layer is formed on the semiconductor substrate;
    removing a portion of the active layer to form an opening in the active layer;
    forming a second insulator layer adjacent the active layer and on the first insulator layer;
    forming a contact opening in the second insulator layer and the first insulator layer;
    forming a conductive material within the contact opening;
    forming a doped region within the semiconductor substrate under the area of the opening by implanting through the opening in the active layer before forming the second insulator layer, wherein the doped region is the first conductivity type and is sufficiently heavily doped to be able to form the contact to the conductive material; and
    forming a transistor in the active layer after forming the doped region.

* * * * *